United States Patent
Ishida et al.

(10) Patent No.: US 7,106,766 B2
(45) Date of Patent: Sep. 12, 2006

(54) OPTICAL DEVICE, METHOD OF MANUFACTURING THE SAME, OPTICAL MODULE, OPTICAL TRANSMISSION SYSTEM

(75) Inventors: Kaoru Ishida, Shijyonawate (JP); Tsuguhiro Korenaga, Katano (JP)

(73) Assignee: Matsushita Electric Industrial Co., Ltd.

( * ) Notice: Subject to any disclaimer, the term of this patent is extended or adjusted under 35 U.S.C. 154(b) by 191 days.

(21) Appl. No.: 10/400,981

(22) Filed: Mar. 27, 2003

(65) Prior Publication Data

US 2004/0028095 A1 Feb. 12, 2004

(30) Foreign Application Priority Data

Mar. 29, 2002 (JP) ............................. 2002-097234

(51) Int. Cl.
*H01S 3/04* (2006.01)
*H01L 23/34* (2006.01)

(52) U.S. Cl. .................... 372/36; 257/706; 257/717

(58) Field of Classification Search .................. 372/36, 372/50
See application file for complete search history.

(56) References Cited

U.S. PATENT DOCUMENTS

| 5,372,186 A | 12/1994 | Taki et al. |
| 6,156,980 A | 12/2000 | Peugh et al. |
| 6,188,707 B1 * | 2/2001 | Irwin et al. ............... 372/43 |
| 6,301,278 B1 * | 10/2001 | Uchida ..................... 372/36 |
| 2003/0021550 A1 * | 1/2003 | Korenaga et al. .......... 385/88 |

FOREIGN PATENT DOCUMENTS

| CN | 1083305 A | 3/1994 |
| EP | 0 638 829 A | 2/1995 |
| JP | 08-194137 A | 7/1996 |
| JP | 2002-131593 | 5/2002 |
| WO | WO 02/14917 A | 2/2002 |

OTHER PUBLICATIONS

European Search Report for Application No. EP 03 00 6807, dated Nov. 26, 2004.
Chinese Office Action for 03108802.3, dated Dec. 30, 2005 (with English Translation).

* cited by examiner

*Primary Examiner*—James Menefee
(74) *Attorney, Agent, or Firm*—RatnerPrestia

(57) ABSTRACT

In a conventional optical device which mounts a semiconductor light emitting element, the processing is difficult and a manufacturing process cost is expensive because of the necessity of forming via holes in a substrate.

An optical device comprises a laser diode which needs heat radiation, a glass substrate which is integrally molded into a mold glass for arranging the laser diode, a metallic heat sink arranged at an edge of the glass substrate for radiating heat generated from the laser diode, wherein an active layer proximity surface of the laser diode is arranged to oppose the heat sink, both of them are connected with a conductive paste through a lateral groove formed in the glass substrate.

13 Claims, 15 Drawing Sheets

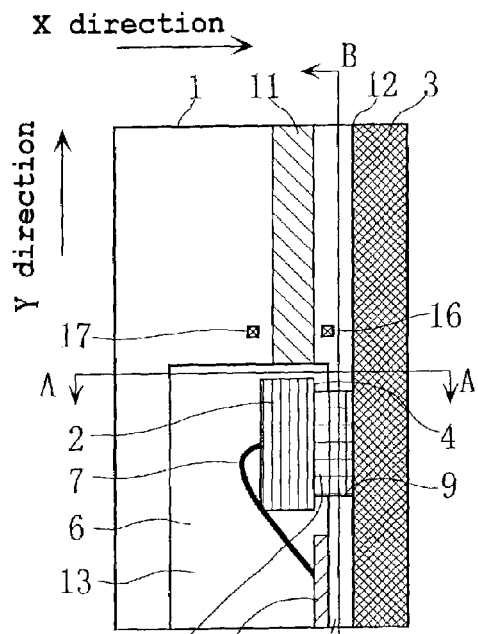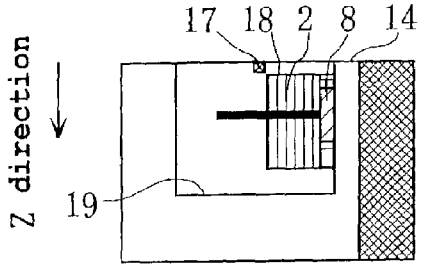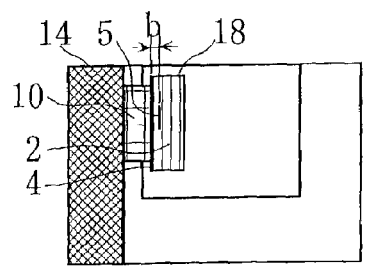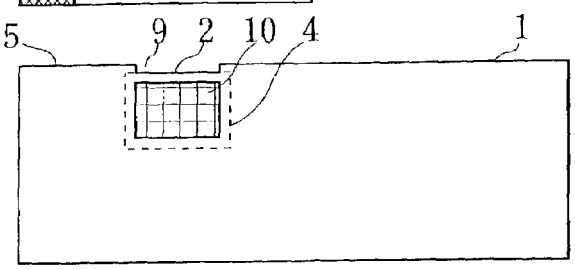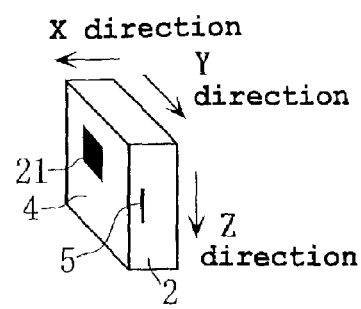

Fig. 15 (a) PRIOR ART
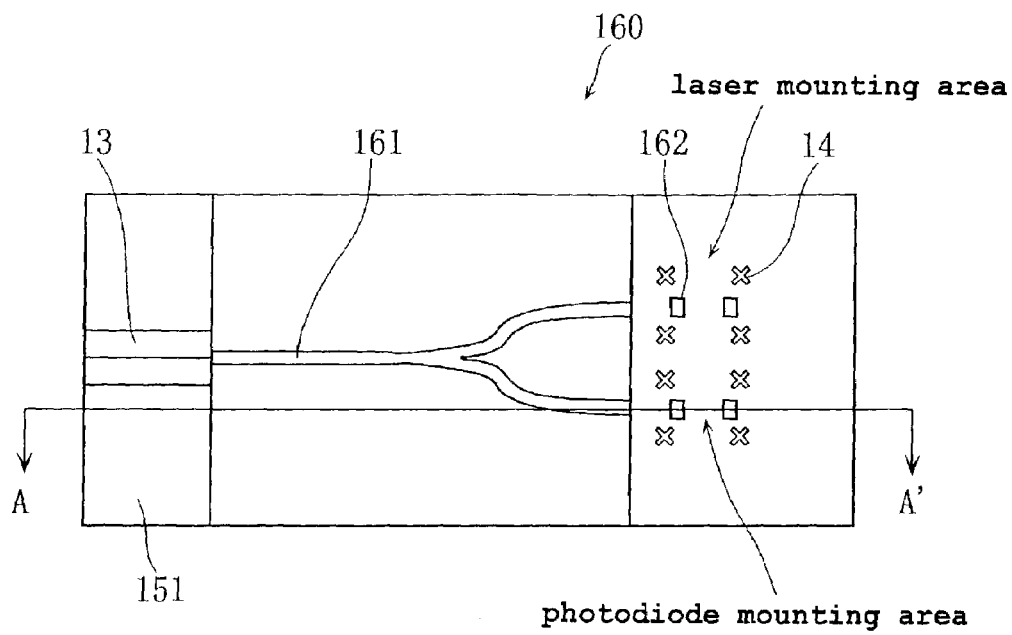
Fig. 15 (b) PRIOR ART
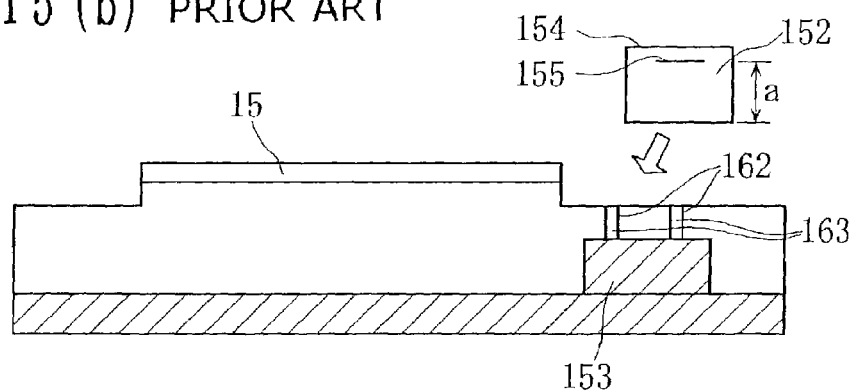
cross section on line A-A'

OPTICAL DEVICE, METHOD OF MANUFACTURING THE SAME, OPTICAL MODULE, OPTICAL TRANSMISSION SYSTEM

BACKGROUND OF THE INVENTION

1. Field of the Invention

The present invention relates to an optical device which mounts a semiconductor light emitting element on a substrate including a light waveguide path, a method of manufacturing the same, an optical module, and an optical transmission system.

2. Related Art of the Invention

FIGS. 15(a) and (b) show a conventional optical transmission module 160 mounting a semiconductor light emitting element 152 on a glass substrate 151 including a waveguide path 161. When the semiconductor light emitting element 152 mounted on the glass substrate 151 is an edge emitting type element and a high speed operation is required, it is arranged on the glass substrate 151 so that a surface which opposes an active layer junction surface (emitting portion) 155 of the semiconductor light emitting element 152 and has the smallest distance from the active layer junction surface 155 (i.e., active layer proximity surface 154) of the element faces upper. Via holes 162 are then formed in the glass substrate 151, heat generated in the semiconductor light emitting element 152 is radiated to a metal heat sink 153 arranged on the lower side of the glass substrate 151 through a conductive paste 163 which fills the via holes 162, and a common ground potential is simultaneously obtained.

In this case, in order to increase a heat radiation effect from the semiconductor light emitting element 152 to the heat sink 153, it will be desirable to reduce thermal resistance (i.e., increase thermal conductivity) of a thermal path to the heat sink 153 from the semiconductor light emitting element 152. That is, considering the via holes 162 and the conductive paste 163 which fills them to be a thermal resistance element, it will be desirable to decrease the glass substrate 151 in thickness where the via holes 162 are formed (i.e., shorten the thermal resistance element in length), or to increase the diameter of the via holes 162 in width (i.e., increase the diameter of the thermal resistance material in width). However, there is a limit to decreasing the glass substrate 151 in thickness since the integrity of the glass substrate 151 of its own would decrease in strength. In addition, there is also a limit to increasing the diameter of the via holes 162 in width since the glass substrate 151 would decrease in strength. Thus, the heat generated from the semiconductor light emitting element 152 has been radiated to the heat sink 153 through a plurality of the via holes 162 not by increasing the diameter of the via holes 162 in width but by forming a number of the via holes 162 on the glass substrate 151 as illustrated in FIG. 15 (See Japanese Patent gazette Laid-Open No. 2002-131593. The disclosure of the above document is incorporated herein by reference in its entirety.)

However, forming a number of the via holes 162 with a high aspect ratio in the glass substrate 151 as described above has been a factor in increasing the cost because of manufacturing difficulty and an increase of manufacturing process. In addition, there have been cases where even when a number of the via holes 162 in the glass substrate 151 have been formed, the thermal resistance to the heat sink 153 from the semiconductor light emitting element 152 has not been able to be reduced, so that the heat radiation to the heat sink 153 from the semiconductor light emitting element 152 has not been enough. In that case, heat radiation from other heat radiation paths (e.g., heat radiation from peripheral air) must be depended on, in addition, the speed of heat transfer from the semiconductor light emitting element 152 to the heat sink 153 is not high enough, so it is necessary to increase the heat sink 153 by one semiconductor light emitting element 152 in size, therefore, the heat sink 153 having large area has been needed in order to manufacture one optical device, further, increasing packaging density on the glass substrate 151 corresponding thereto has not been achieved. In addition, forming a number of the via holes 162 in the glass substrate 151 reduces the glass substrate 151 in strength, resulting in upsizing the optical device and increasing the cost corresponding thereto.

SUMMARY OF THE INVENTION

The object of the present invention is to provide a low cost optical device, a method of manufacturing the same, an optical module, or an optical transmission system with decreased manufacturing process in light of the above problems.

Further, the object of the present invention is to provide an optical device, a method of manufacturing the same, an optical module, or an optical transmission system with a small size and a low cost.

The 1st aspect of the present invention is an optical device, comprising:

a semiconductor element requiring heat radiation, a first substrate providing a mount for said semiconductor element; and a heat dissipation plate arranged at an edge of said first substrate for radiating heat generated from said semiconductor element.

The 2nd aspect of the present invention is the optical device according to the 1st aspect, wherein said semiconductor element is a semiconductor light emitting element having an active layer junction surface, and two outside surfaces opposed said active layer junction surface, in which said heat dissipation plate is arranged to oppose said active layer junction surface.

The 3rd aspect of the present invention is the optical device according to the 2nd aspect, in which a large portion of the outside surface closer to said heat dissipation plate of said semiconductor light emitting element is connected to said heat dissipation plate through a groove or a hole formed in said first substrate.

The 4th aspect of the present invention is the optical device according to the 2nd aspect, wherein said semiconductor light emitting element is arranged so that the distance between the outside surface closer to said heat dissipation plate and said active layer junction surface becomes narrower than the distance between the outside surface farther from said heat dissipation plate and said active layer junction surface.

The 5th aspect of the present invention is the optical device according to the 2nd aspect, in which said first substrate is integrally molded into a mold glass.

The 6th aspect of the present invention is the optical device according to the 1st aspect, in which said heat dissipation plate is metallic, and said heat dissipation plate and said semiconductor device are connected by a conductive paste.

The 7th aspect of the present invention is the optical device according to the 3rd aspect, in which said groove or hole has a shape spreading toward said heat dissipation plate from said semiconductor light emitting element.

The 8th aspect of the present invention is the optical device according to the 1st aspect, in which a second substrate is further mounted to said heat dissipation plate.

The 9th aspect of the present invention is a method of manufacturing an integrally molded optical device having a waveguide comprising the steps of arranging on a concave portion a semiconductor light emitting element having an active layer junction surface being connected to said waveguide path, extending a groove to an edge of said glass substrate from said concave portion, positioning a horizontal position of said semiconductor light emitting element within said concave portion of said glass substrate with a horizontal position marker, and positioning a vertical position of said semiconductor light emitting element within said concave portion of said glass substrate with a vertical position marker, arranging at an edge a heat dissipation plate for radiating heat generated from said semiconductor light emitting element, arranging said semiconductor light emitting element within said concave portion so that an active layer junction surface of said semiconductor light emitting element is substantially vertical relative to said glass substrate and opposes said heat dissipation plate, and positioning of said semiconductor light emitting element within said concave portion is performed by using said horizontal position marker(16) and said vertical position marker.

The 10th aspect of the present invention is the method of manufacturing the optical device according to the 9th aspect, in which when said semiconductor light emitting element is arranged within said concave portion so that the active layer junction surface of said semiconductor light emitting element is substantially vertical relative to said glass substrate and is opposed said heat dissipation plate, said semiconductor light emitting element is arranged through a conductive material.

The 11th aspect of the present invention is an optical module for use in transmission, comprising:

a light output terminal;

an optical device according to the 2nd aspect connected to said light output terminal; and an electrical input terminal connected to said optical device.

The 12th aspect of the present invention is an optical module for use in reception, comprising;

a light input terminal;

an optical device according to the 2nd aspect, being connected to said light input terminal, comprising a semiconductor light receiving element instead of said semiconductor light emitting element; and an electrical output terminal connected to said optical device.

The 13th aspect of the present invention is an optical module for use in transmission and reception, comprising;

a light input/output terminal;

an optical device as in the 2nd to the 8th aspects, being connected to said light input/output terminal, and further comprising a semiconductor light receiving element; and an electrical input terminal, and an electrical output terminal connected to said optical device.

The 14th aspect of the present invention is an optical transmission system for use in transmission and reception, comprising:

an optical module for use in transmission according to the 11th aspect;

an optical fiber cable connected to said optical module for use in transmission; and an optical module for reception according to the 12th aspect, connected to said optical fiber cable.

The 15th aspect of the present invention is an optical transmission system for use in transmission and reception, comprising:

an optical module for use in transmission and reception according to the 13th aspect; and an optical fiber cable connected to said optical module for use in transmission and reception.

BRIEF DESCRIPTION OF THE DRAWINGS

FIGS. 1(a)–1(e) show a structural drawing of an optical device of preferred embodiment 1 of the present invention;

FIGS. 15(a)–15(b) show a plane and a side view of a prior-art optical device;

DESIGNATION OF REFERENCE NUMERALS

Figure 2:
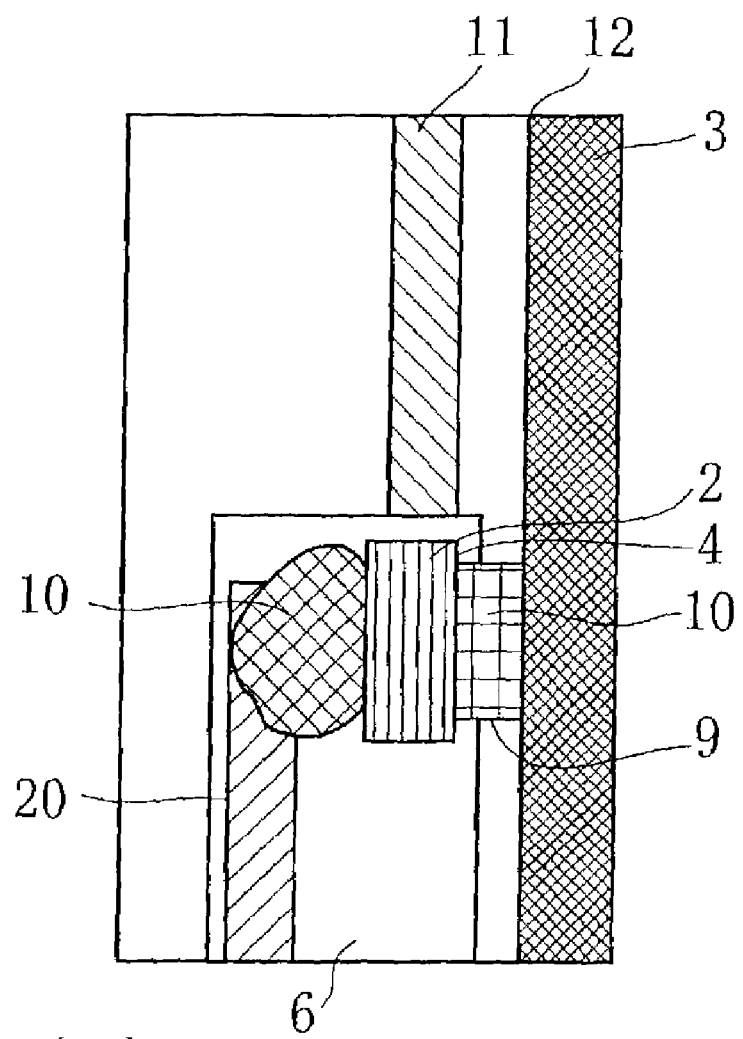
FIGS. 2(a)–2(b) show a structural drawing of an optical device of preferred embodiment 1 of the present invention.
Figure 2:
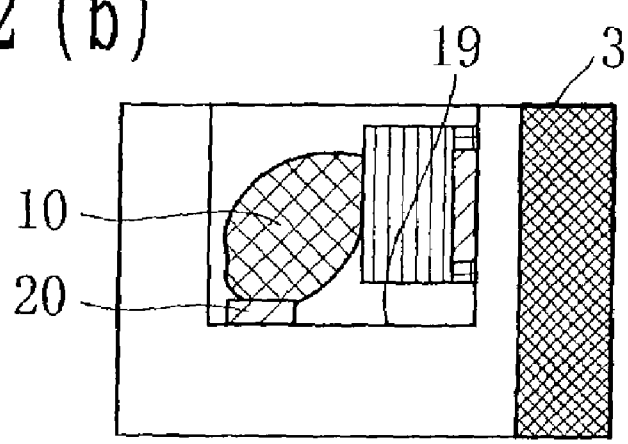

1: glass substrate
2: laser diode
3: heat sink
4: active layer proximity surface
5: active layer junction surface
6: concave portion
8: wiring pattern
9: lateral groove
10: conductive paste
11: waveguide path 15: side wall
16: horizontal position marker
17: vertical position marker

PREFERRED EMBODIMENTS OF THE INVENTION

Preferred Embodiment 1

FIG. 1 shows a plain view of an optical device according to preferred embodiment 1 of the present invention.

For an optical device of the preferred embodiment 1 of the present invention, a waveguide path 11 is formed in parallel with a longitudinal direction of a glass substrate 1 that is one example of a first substrate of the present invention, a concave portion 6 that is connected to the waveguide path 11 and one example of a concave portion of the present invention is then formed, a metallic heat sink 3 that is a heat dissipation plate of the present invention is joined with an edge 12 of the glass substrates 1 from a side so as to be bonded together at the edge 12 of the glass substrate 1. A portion of the concave portion 6 farther from the waveguide path 11 (called "distal") is not surrounded by a wall and is opened toward the distal direction (refer to FIGS. 1(a) and (b)). A lateral groove 9 that is one example of a groove of the present invention is then formed in a side wall 15 of the glass substrate 1 to which the heat sink 3 is bonded so as to connect the concave portion 6 to the heat sink 3. FIG. 1(d) shows a cross section taken on line B—B of FIG. 1(a). In this preferred embodiment, the lateral groove 9 is formed so that its cross section becomes a rectangular shape as shown in FIG. 1(d).

Figure 3:
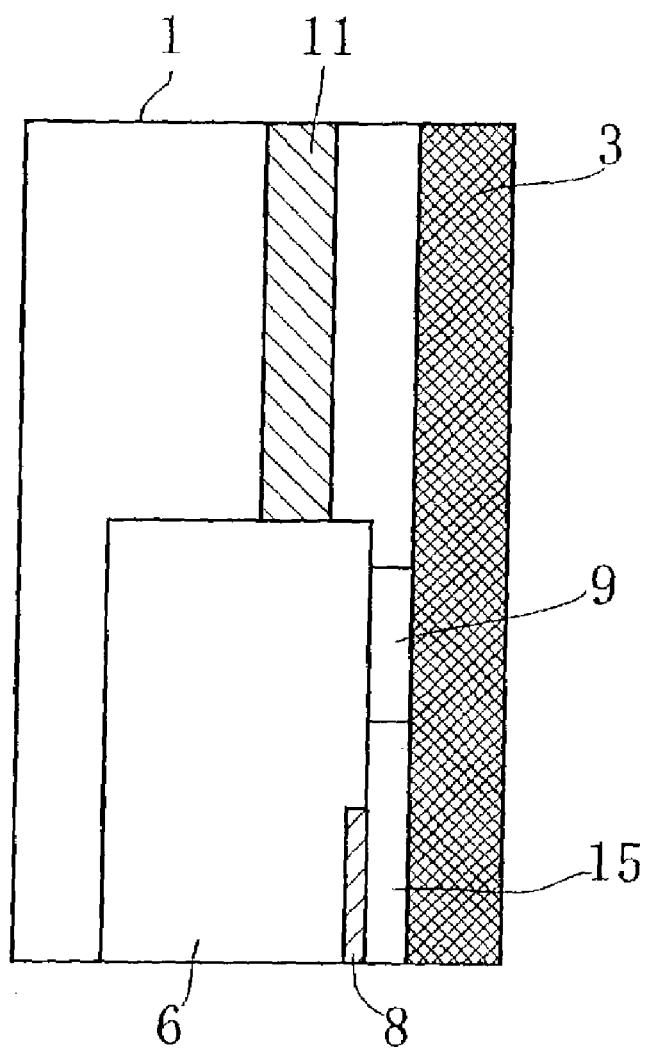
FIGS. 3(a)–3(b) show a structural drawing of an optical device in the manufacturing process according to preferred embodiment 1 of the present invention.
Figure 3:
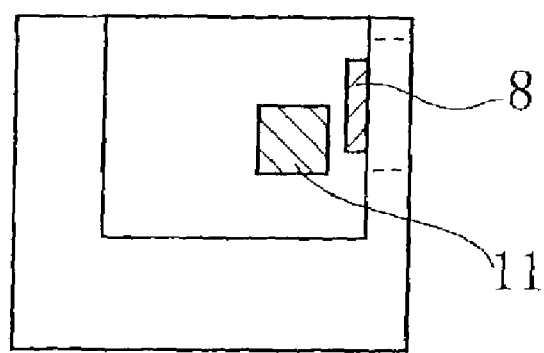

A horizontal position marker 16 that is one example of a horizontal position marker of the present invention and a vertical position marker 17 that is one example of a vertical position marker of the present invention for positioning a laser diode 2 in the concave portion are also formed in predetermined locations on the glass substrate 1. The waveguide path 11, the concave portion 6, the lateral groove 9, the horizontal position marker 16, and the vertical position marker 17 are integrally molded into the glass substrate 1. A wiring pattern 8 is then arranged at the distal portion from the waveguide path 11 of the side wall 15 in which the lateral groove 9 is formed (refer to FIGS. 3(a) and (b)), and is connected to a signal line (not shown in figure) needed to drive a laser diode 2.

The laser diode 2 that is one example of a semiconductor light emitting element of the present invention is then arranged on the side wall 15 in the concave portion 6. FIG. 1(c) shows a cross section taken on line A—A of FIG. 1(a). The laser diode 2 is an edge emitting type, an active layer junction surface 5 that is one example of a junction surface of an active layer of the present invention and is an emitting portion thereof is arranged in parallel with each layer (not shown in figure) in the laser diode 2 as shown in FIG. 1(c). The active layer junction surface 5 is then arranged spaced b from an active layer proximity surface 4 that is one example of an outside surface of the present invention. The laser diode 2 is then arranged on the side wall 15 of the concave portion 6 opposed the heat sink 3 through the lateral groove 9 so that its active layer proximity surface 4 becomes substantially vertical to a surface 14 of the glass substrate 1. In this case, the distance between the active layer proximity surface 4 and the active layer junction surface 5 of the laser diode 2 is shorter than the distance between an outside surface opposed the active layer proximity surface 4 and the active layer junction surface 5 of the laser diode 2. A conductive paste 10 that is one example of a conductive paste of the present invention fills the lateral groove 9, and the heat sink 3 is connected to the active layer proximity surface 4 of the laser diode 2. In this case, a large portion of the active layer proximity surface 4 of the laser diode 2 is connected to the heat sink 3 through the conductive paste 10 as shown by dashed lines in FIG. 1(d). A conductive paste containing components, such as copper, copper tungsten, alumina etc., is employed for this purpose.

In addition, the laser diode 2 is positioned at an appropriate position in a parallel direction to the waveguide path 11 (that is, Y direction that is the longitudinal direction of the glass substrate 1 as shown FIG. 1(a)), in the direction perpendicular to the waveguide path 11 (that is, X direction that is perpendicular to Y direction), and in the vertical direction (that is, Z direction that is the depthwise direction of the glass substrate 1)

(Positioning Manner will be Described Below).

The wiring pattern 8 and the laser diode 2 are then connected by a wire 7 extending from a surface opposed the active layer proximity surface 4 of the laser diode 2 to a distal portion within the concave portion.

In addition, the laser diode 2 has an internal laser marker 21 on the active layer proximity surface 4 as shown in FIG. 1(e) The internal laser marker 21 is formed as a part of patterns when the laser diode 2 is manufactured, positions of the internal laser marker 21 in Y and Z directions are precisely controlled and determined so that they have predetermined spaces to the active layer junction surface 5 in the Y and Z directions when the laser diode 2 is manufactured.

In addition, the distance from the active layer proximity surface 4 to the active layer junction surface 5 of the laser diode 2 (i.e., distance b shown in FIG. 1(c)) is precisely controlled when the laser diode 2 is manufactured.

A description will be made of how to position the laser diode 2 in the concave portion 6 of the glass substrate 1.

The laser diode 2 connected to the wiring pattern 8 is arranged as described above in the concave portion 6 formed as above, and the conductive paste 10 fills a gap between the laser diode 2 and the heat sink 3. In the concave portion 6 of the glass substrate 1, a UV resin (ultraviolet curing type resin) fills the periphery of the laser diode 2, a position of the laser diode 2 in the X direction is adjusted using a manipulator (not shown) so that a position of the X direction of the active layer proximity surface 4 and a position of the X direction of the horizontal position marker 16 keep a predetermined distance (or coincide). A position of the laser diode 2 in the Y direction is then adjusted so that a position of the horizontal position marker 16 in the Y direction and a position of the internal laser marker 21 in the Y direction keep a predetermined distance. A position of the laser diode 2 in the Z direction is then similarly adjusted using the manipulator so that a reference plane of the vertical position marker 17 in the Z direction keeps (or coincides) a predetermined distance from a reference point of the internal laser marker 21 in the Z direction. By following the above procedure, the position of the active layer junction surface 5 in the X, Y, and Z directions can be precisely positioned to the waveguide path 11.

Figure 16:
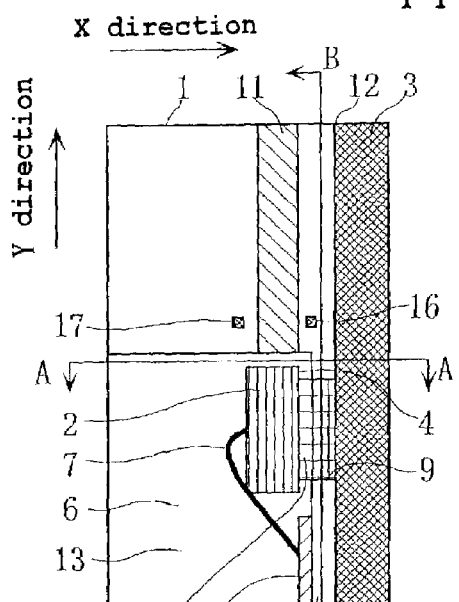
FIGS. 16(a)–16(e) show an alternative example of the construction of an optical device according to preferred embodiment 1 of the present invention.
Figure 16:
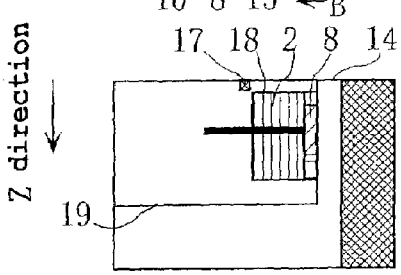
Figure 16:
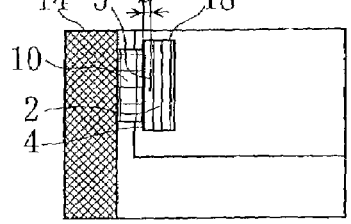
Figure 16:
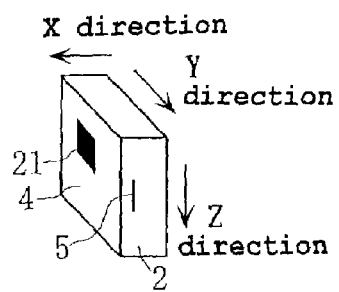
Figure 16:
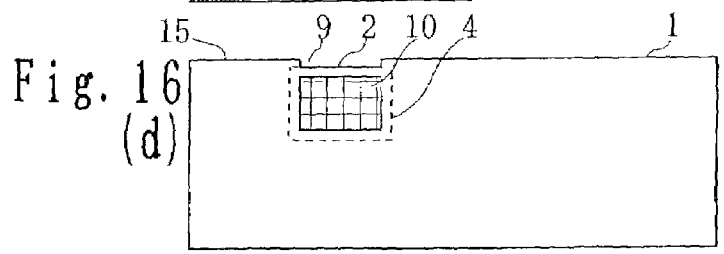

After fixing the position of the laser diode 2 in the concave portion 6 of the glass substrate 1, the laser diode 2 is bonded to the position where it has been positioned by irradiating the UV resin which fills the waveguide path 11 with ultraviolet rays or hardening the conductive paste 10 into a solid. Incidentally, in the discussion of the positioning manner described above, although it is explained that the conductive paste 10 fills the gap between the laser diode 2 and the heat sink 3, the UV resin fills the periphery of the laser diode 2, then the position in the X direction and the position in the Y direction are determined, but it may be possible that the conductive paste 10 fills the gap between the laser diode 2 and the heat sink 3 first, and by keeping this state, the position of the laser diode 2 is adjusted using the manipulator by following the same manner as above, then the conductive paste 10 is hardened into a solid. In that case, after fixing the position of the laser diode 2 by hardening the conductive paste into a solid, the UV resin may fill the periphery of the laser diode 2 in the concave portion 6. In addition, although there is side wall on the surface where the laser diode is not mounted in FIG. 1, such a side wall may not exist as shown in FIG. 16. The manipulator operation described above and bonding the wire 7 to the wiring pattern 8 become easier according to these configurations.

A description will be made of an operation of the optical device configured as above.

When predetermined electrical signal is supplied to the laser diode 2 from the wiring pattern 8 through the wire 7, laser light is emitted from the active layer junction surface 5 of the laser diode 2 and is transmitted through the waveguide path 11. At this moment, most heat is generated from the active layer proximity surface 4, but most of that heat is transferred to the heat sink 3 through the conductive paste 10 in the lateral groove 9, and then radiated to the air. In addition, a ground potential is simultaneously provided to the laser diode 2 through the conductive paste 10.

According to the procedure described above, since it is not necessary to form the via holes 162 in the surface of the glass substrate 1, it is possible to manufacture the optical device with the easy and less manufacturing process. In addition, by positioning as above, the active layer junction surface 5 can be positioned to the waveguide path 11 by a simple adjustment operation precisely.

In addition, the heat radiation effect is increased compared to the conventional device since it is possible to radiate the heat to the heat sink 3 from the surface that becomes the highest temperature (i.e., active layer proximity surface 4) of the laser diode 2. In addition, since most of the area of the active layer proximity surface 4 of the laser diode 2 is connected to the conductive paste and the heat generated from the active layer proximity surface 4 can be radiated to the heat sink 3 through one lateral groove 9, the thermal resistance from the laser diode 2 to the heat sink 3 becomes smaller and the heat radiation effect is more effective. Consequently, the laser diode 2 is not influenced by the heat, so it is possible to stabilize the operation. As discussed above, since the heat generated from the laser diode 2 can be sufficiently radiated, the shape of the heat sink can be decreased and still it is not necessary to consider the heat radiation, for example through surrounding air, it is possible to reduce the size of the optical device in accordance with the optical device of preferred embodiment 1.

Incidentally, although it is explained in the above discussion that the laser diode 2 is connected to the wiring pattern 8 arranged on the side wall 15 through the wire 7, a wiring pattern 20 may be arranged on the bottom surface 19 of the concave portion 6, and the wiring pattern 20 and the laser diode 2 may be connected by the conductive paste 10 as shown in FIGS. 2(a) and (b).

Preferred Embodiment 2

Figure 4:
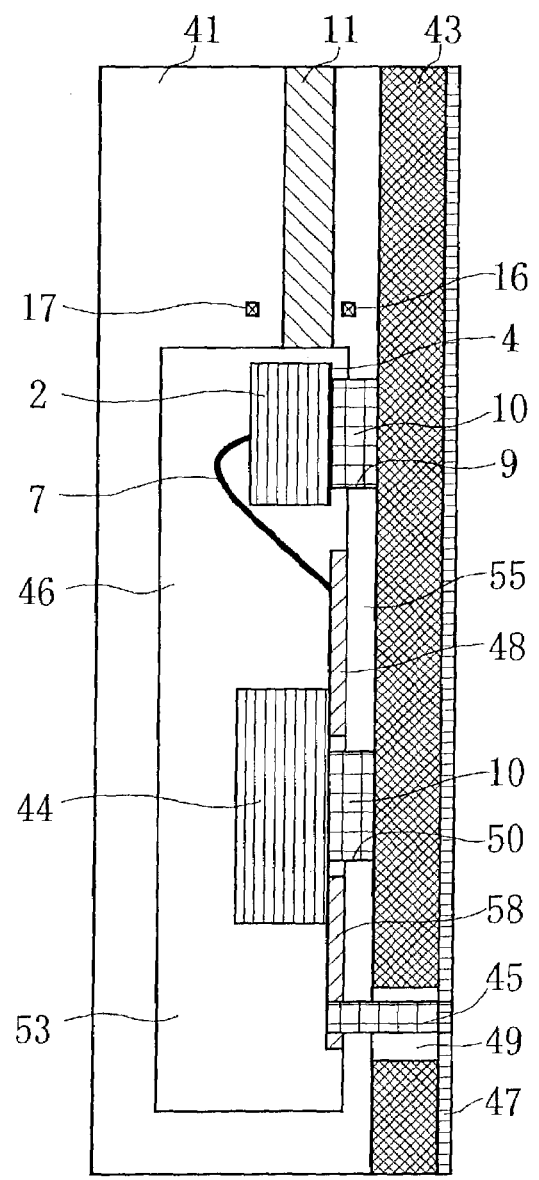
FIGS. 4(a)–4(b) show a structural drawing of an optical device of preferred embodiment 2 of the present invention.
Figure 4:
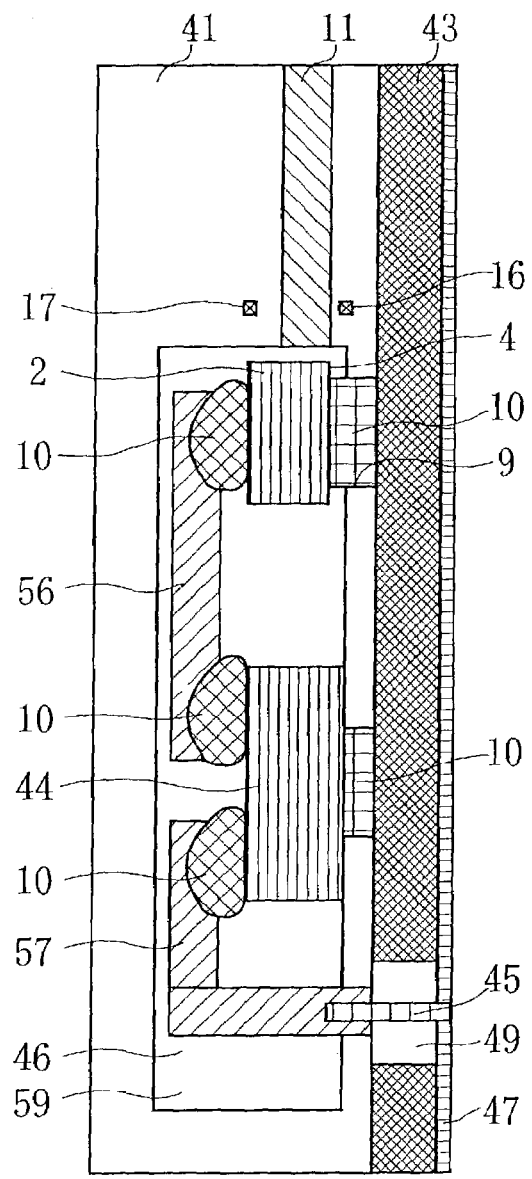

FIG. 4 shows a configuration of an optical device 2 according to the preferred embodiment in accordance with the present invention.

According to an optical device of this preferred embodiment, a concave portion 46 having a longitudinal shape is formed in a glass substrate 41 having a longitudinal shape, a driver IC 44 for driving a laser diode 2 as well as the laser diode 2 are arranged in the concave portion 46. In this case, components same as those described with reference to preferred embodiment 1 are denoted by the same reference numbers, its description will be omitted and only the different components will be described.

A wiring pattern 48 arranged in the distal direction of the laser diode 2 on a side wall 55 is connected to the wire 7 which is connected to the laser diode 2. The driver IC 44 is then arranged on the side wall 55, a lateral groove 50 for connecting both the driver IC 44 and a heat sink 43 is formed between them, and a conductive paste 10 fills the lateral groove 50 so as to connect the heat sink 43 and the driver IC 44. In this case, the driver IC 44 is arranged on the side wall 55 in contact with a wiring pattern 58 arranged in the distal direction from the vicinity of the wiring pattern 48 and the lateral groove 50.

On the other hand, a dielectric substrate 47 that is one example of a second substrate of the present invention is attached (bonded) to the heat sink 3, and a wiring pattern (not shown) for supplying an electrical signal to the driver IC 44 through a signal junction 45 is formed on the dielectric substrate 47. In addition, a hole portion 49 is formed in the distal portion of the heat sink 43. The signal junction 45 made with conductive materials is then inserted into the hole portion 49, and the wiring pattern 58 and the above wiring pattern formed on the dielectric substrate 47 are connected. Incidentally, the hole which penetrates through the signal junction 45 to the side wall 55 of the glass substrate 1 is integrally molded when the glass substrate 1 is molded.

In the optical device according to such configuration, when the needed electrical signal is supplied to the driver IC 44 through the dielectric substrate 47, the signal junction 45, and the wiring pattern 58, thereby the driver IC 44 supplies the laser diode 2 with the electrical signals which are needed for driving the laser diode 2 through the wiring pattern 48 and the wire 7. The laser diode 2 then emits light to a waveguide path 11 in response to the supplied electrical signal. At this moment, the heat generated from the laser diode 2 is radiated to the heat sink 43 through the conductive paste 10 which fills the lateral groove 9, and the heat generated from the driver IC is radiated to the heat sink 43 through the conductive paste 10 which fills the lateral groove 50. In addition, a common ground potential is provided to both the laser diode 2 and the driver IC 44 at the same time.

As described above, according to the optical device in accordance with this preferred embodiment, even when a plurality of semiconductor elements that need to radiate the heat are mounted on the glass substrate 41, it is possible to reduced the size of the optical device since the heat generated from these semiconductor elements can effectively be radiated to the heat sink 43 similar to the case of preferred embodiment 1. That is, a package density of parts on the glass substrate 41 can be increased. In addition, the package density of parts can further be increased when the dielectric substrate 47 is bonded to the heat sink 43. If the heat dissipation efficiency from the heat sink 43 itself is decreased by bonding the dielectric substrate 47 to the heat sink 43, it may be preferable to bond the dielectric substrate 47 with an appropriate area or to a location thereof wherein the heat radiation from the heat sink 43 does not cause any problems.

Incidentally, according to the description of this preferred embodiment, it is explained that the laser diode 2 is connected to the driver IC 44 through the wire 7 and the wiring pattern 48 arranged on the side wall 55, and the driver IC 44 is connected to the signal junction 45 through the wiring pattern 58, it may be configured that a wiring pattern 56 is arranged on the bottom surface 59 of the concave portion 46 between the laser diode 2 and the driver IC, the laser diode 2 and the wiring pattern 56 are connected by the conductive paste 10, the wiring pattern 56 and the driver IC 44 are connected by the conductive paste 10, a wiring pattern 57 is also arranged on the bottom surface 59 of the concave portion 46 between the driver IC 44 and the signal junction 45, and the wiring pattern 57 and the driver IC 44 are connected by the conductive paste 10 as shown in FIG. 4(*b*). In addition, the driver IC 44 may be connected to the wiring patterns 48 and 58 with wires.

Preferred Embodiment 3

Figure 5:
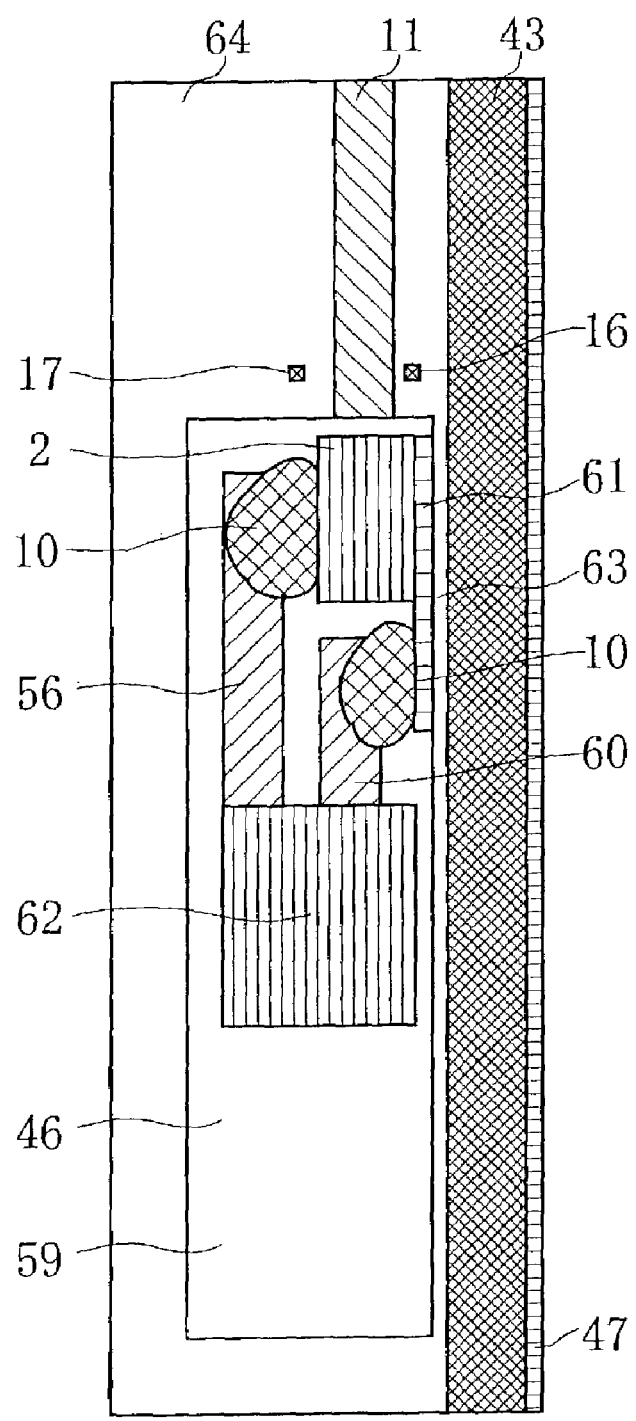
FIG. 5 shows a structural drawing of an optical device of preferred embodiment 3 of the present invention.

FIG. 5 shows a configuration of an optical device according to the preferred embodiment 3 of the present invention.

In the optical device according to this preferred embodiment, it is configured that a lateral groove is not formed in a side wall 63 that is formed in between the concave portion 46 and the heat sink 43, and a heat dissipation piece 61 is arranged between the laser diode 2 and the side wall 63. In this case, the thickness of the side wall 63 is set to be thinner than the thickness of the sidewall 15, 55 as shown in preferred embodiments 1 and 2, and a part of the heat dissipation piece 61 extends in the distal direction from the laser diode 2. A driver IC 62 is then arranged on the bottom surface 59 of the concave portion 46, a wiring pattern 56 is arranged between the laser diode 2 and a signal output portion (not shown in figure) of the driver IC 62, and the wiring pattern 56 and the laser diode 2 are connected by the conductive paste 10. Further, a wiring pattern 60 is arranged on the bottom surface 59 between the driver IC 62 and the heat dissipation piece 61, the wiring pattern 60 is connected to a heat radiation portion of the driver IC 62 (not shown in figure), and the conductive paste 10 connects the wiring pattern 60 with the heat dissipation piece 61. In addition, the driver IC 62 is connected to the wiring pattern on the surface of a glass substrate 64 (not shown in figure).

According to the optical device for such configuration, the heat generated from the laser diode 2 is transferred to the heat sink 43 through the heat dissipation piece 61 and the side wall 63. In addition, the heat generated from the driver IC 62 is transferred to the heat sink 43 through the wiring pattern 60 and the heat dissipation piece 61. Consequently, according to this preferred embodiment, the optical device can be manufactured by means of a simple process.

Preferred Embodiment 4

Figure 6:
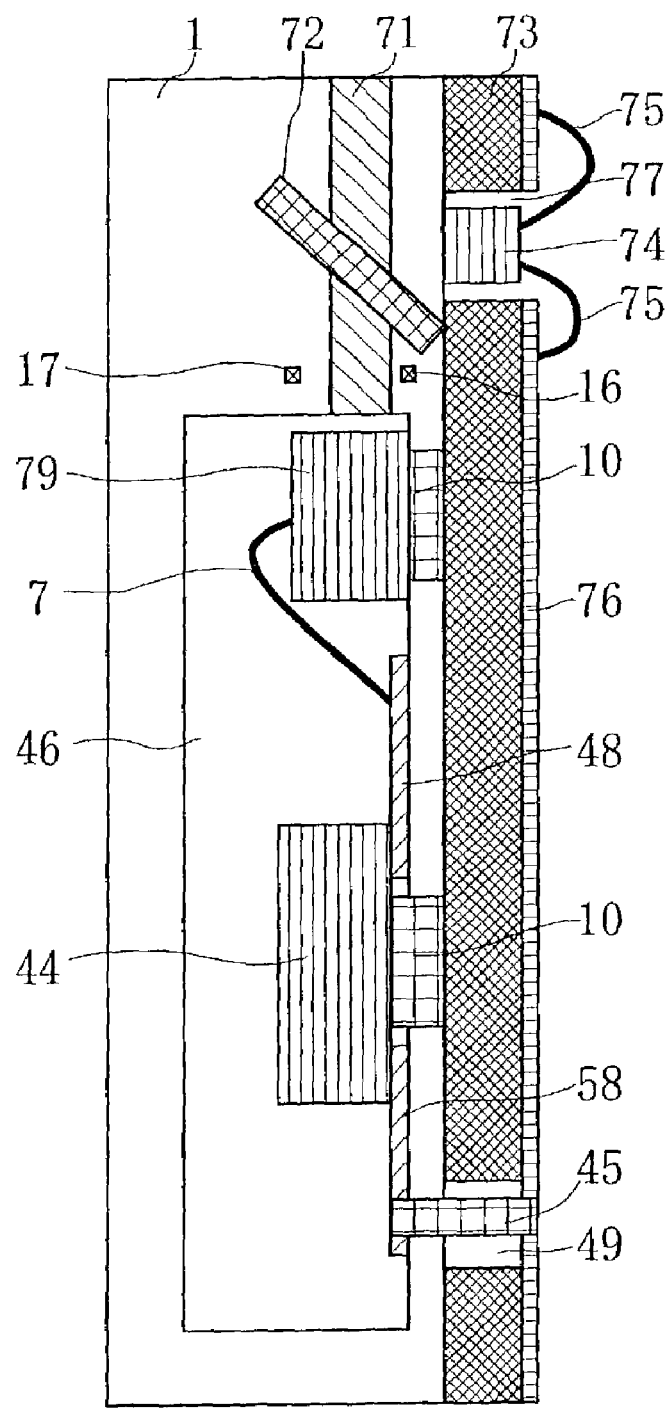
FIG. 6 shows a structural drawing of an optical device of preferred embodiment 4 of the present invention.

FIG. 6 shows a configuration of an optical device according to preferred embodiment 4 of the present invention.

This preferred embodiment is an application of preferred embodiment 2. Components same as those described with reference to preferred embodiments 1 and 2 are denoted by the same reference numbers and the description will be omitted. A wavelength division multiplex filter (called hereinafter WDM filter) 72 is inserted into a waveguide path 71 so that the longitudinal direction thereof is set at an angle of 45 degrees relative to the waveguide path 71 of an optical device according to this preferred embodiment. The WDM filter 72 here is set so as to pass light a wavelength $\lambda 1$ but not light with a wavelength $\lambda 2$ (to reflect). A hole portion 77 is then formed in a heat sink 73 and a dielectric substrate 76 at the side of the WDM filter 72, and a photodiode 74 that is an example of a light receiving element of the present invention for receiving the light with the wavelength $\lambda 2$ is arranged at the edge 12 of the glass substrate 1 in the hole portion 77. The photodiode 74 is connected to a wiring pattern (not shown in figure) on the dielectric substrate 76 through a wire 75. In addition, a laser diode 79 which emits the light with the wavelength $\lambda 1$ is used in this preferred embodiment.

According to the optical device for such configuration, when emitted from the laser diode 79, the light with the wavelength $\lambda 1$ passes the WDM filter 72 and is transmitted from the waveguide path 71. The light with the wavelength $\lambda 2$ which enters the waveguide path 71 is reflected in the side direction by the WDM filter 72 and is received by the photodiode 74. Consequently, according to the optical device of this preferred embodiment, it is possible to achieve a transmitter-receiver which transmits the light with the wavelength $\lambda 1$ and receives the light with the wavelength $\lambda 2$.

Incidentally, according to this preferred embodiment, the WDM filter 72 may be inserted into the waveguide path 71 so that the longitudinal direction thereof is at an angle of other than 45 degrees thereto. In that case, the hole portion 77 is formed and the photodiode 74 is arranged so that the light reflected by the WDM filter 72 is received by the photodiode 74.

In addition, although it is shown that the photodiode 74 is not connected to the heat sink 73 in FIG. 6, it may be preferable, as needed, that it is connected to the heat sink 73 with the wiring pattern (not shown in figure), or the periphery of the photodiode 74 is filled with an electrically non-conductive but thermally conductive paste (not shown in figure) at the hole portion 77.

Preferred Embodiment 5

Figure 7:
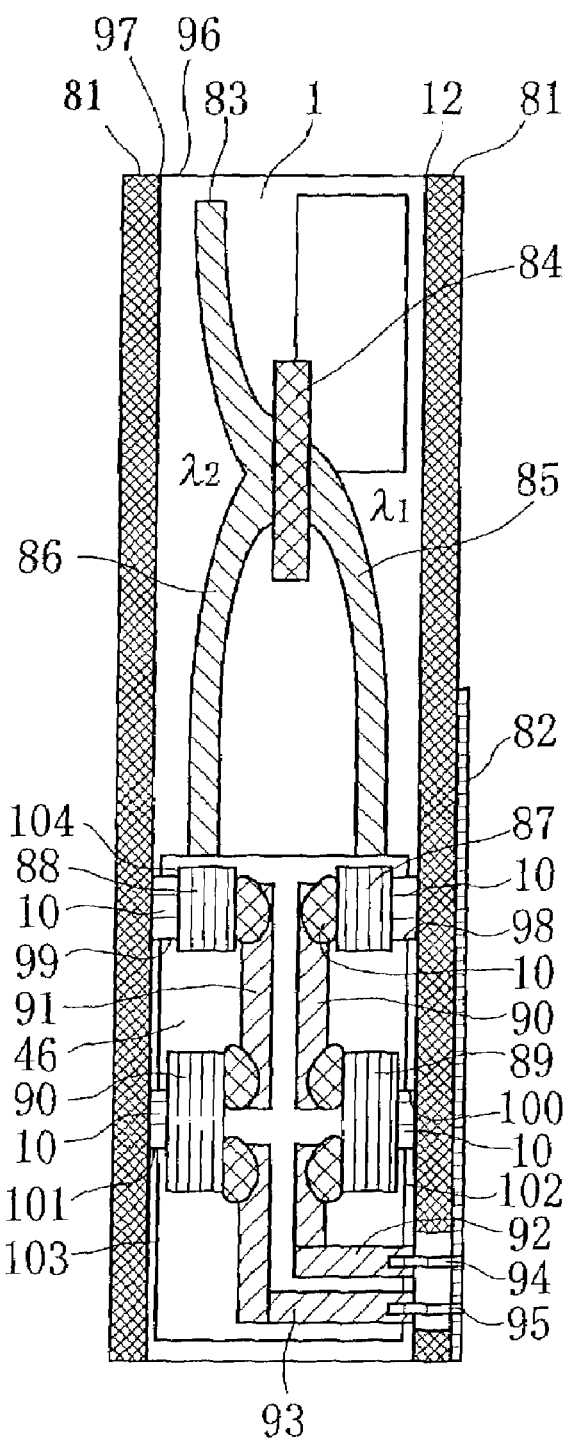
FIG. 7 shows a structural drawing of an optical device of preferred embodiment 5 of the present invention.

FIG. 7 shows a configuration of an optical device according to the preferred embodiment 5.

This preferred embodiment is also an application of preferred embodiment 2. In the optical device of this preferred embodiment, a WDM filter 84 whose longitudinal direction coincides with a longitudinal direction of the glass substrate 1 is arranged. One surface side of the WDM filter 84 is connected to a waveguide path 85 and the other surface side of the WDM filter 84 is connected to a waveguide path 86. The waveguide paths 85 and 86 are then connected to the concave portion 46. In addition, a waveguide path 83 is connected to a portion to which the waveguide path 86 and the WDM filter 84 are connected and the waveguide path 83 extends toward an end portion 96 of the glass substrate 1. The WDM filter 84 here is set so as to pass the light with the wavelength $\lambda 1$ but to reflect the light with the wavelength $\lambda 2$ similar to the WDM filter 72 in preferred embodiment 4.

A heat sink 81 is arranged at one edge 12 of the glass substrate 1 in accordance with the optical device of this preferred embodiment, and the heat sink 81 is arranged at the other edge 97 opposed the edge 12. Lateral grooves 98 and 100 are then formed in a side wall 102 between the concave portion 46 and the heat sink 81, and the laser diode 87 for emitting the light with the wavelength $\lambda 1$ and a driver IC 89 are arranged on the side wall 102, respectively, similar to the case of the laser diode 2 and the driver IC 44 in preferred embodiment 2. The laser diode 87 and the driver IC 89 are then connected by a wiring pattern 90 similar to the case of preferred embodiment 2 and the driver IC 89 and a signal junction 94 are connected by a wiring pattern 92.

In addition, lateral grooves 99 and 101 are formed in a side wall 101 between the concave portion 46 and a heat sink 82, and a laser diode 88 for emitting the light with the wavelength $\lambda 2$ and a driver IC 90 are arranged on the side wall 101 similar to above. In this case, the laser diode 88 is arranged so that an active layer proximity surface 104 thereof is opposed the heat sink 82. In addition, similar to above, the laser diode 88 and the driver IC 90 are connected by the wiring pattern 91 and the driver IC 90 and a signal junction 95 are connected by a wiring pattern 93. The signal junctions 94 and 95 are connected to the wiring pattern (not shown in figure) formed on a dielectric substrate 82 arranged on the side of the heat sink 81, respectively.

According to the optical device configured like this, the light that is emitted by the laser diode 87 passes the WDM filter 84 and reaches the waveguide path 83 through the waveguide path 85, the light that is emitted by a laser diode 104 is reflected by the WDM filter 84 and reaches the waveguide path 83 through a waveguide path 86. Consequently, the light with the wavelength $\lambda 1$ that is emitted by the laser diodes 87 and the light with the wavelength $\lambda 2$ that is emitted by the laser diode 88 are mixed, and then reach the waveguide path 83. As a result, the light with the wavelengths $\lambda 1$ and $\lambda 2$ are mixed, and then output from the waveguide path 83.

In accordance with the optical device of the preferred embodiment, it is possible to provide a high performance optical transmission module having a high package density on the glass substrate 1 by means of a simple manufacturing process.

Preferred Embodiment 6

Figure 8:
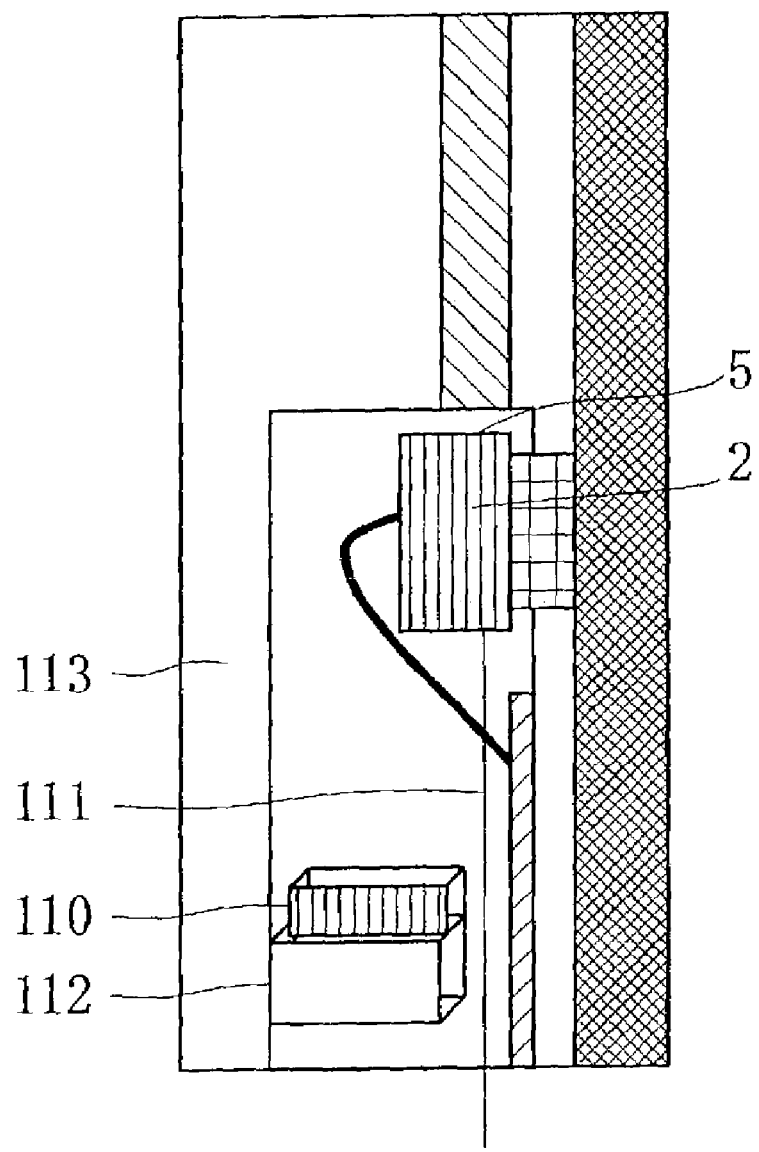
FIG. 8 shows a structural drawing of an optical device of preferred embodiment 6 of the present invention.
Figure 9:
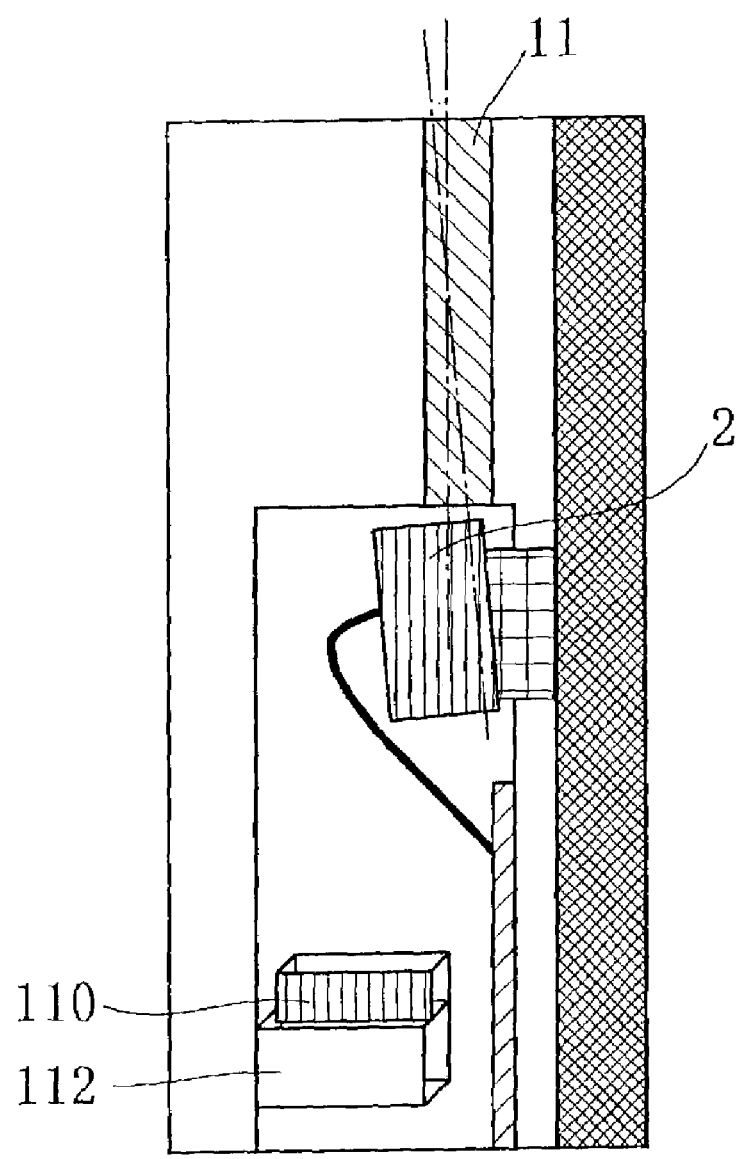
FIG. 9 shows a structural drawing of an optical device of preferred embodiment 6 of the present invention.

FIGS. 8 and 9 show a configuration of an optical device according to the preferred embodiment 6.

This preferred embodiment 6 is a specific implementation example of an optical device of preferred embodiment 1. Consequently, components same as those described with reference to preferred embodiments 1 are denoted by the same reference numbers and the description will be omitted. In the optical device shown in FIG. 8, a monitor photodiode 110 is arranged on a pedestal base 112 arranged on a side wall 113 in the distal direction from the laser diode 2. In this case, the monitor photodiode 110 is displacedly arranged relative to an elongation line 111 of an emitting portion of the active layer junction surface 5 of the laser diode 2.

According to the optical device for such configuration, the monitor photodiode 110 can detect the light which leaks from the opposite side of the emitting portion of the laser diode 2 and monitor the operation of the laser diode 2. The monitor photodiode 110 can prevent the light which leaks from the laser diode 2 from entering the laser diode 2 again after being reflected by the monitor diode 110 because of being displacedly arranged relative to the elongation 111 of the emitting portion of the laser diode 2.

In addition, in the optical device shown in FIG. 9, the longitudinal axis of the laser diode 2 is obliquely arranged at an angle of up to approximately 3 degrees relative to a waveguide path 11. By arranging the laser diode 2 like this, it is possible to prevent the light which travels the waveguide path 11 from entering the laser diode 2 again after being reflected.

Preferred Embodiment 7

Figure 10:
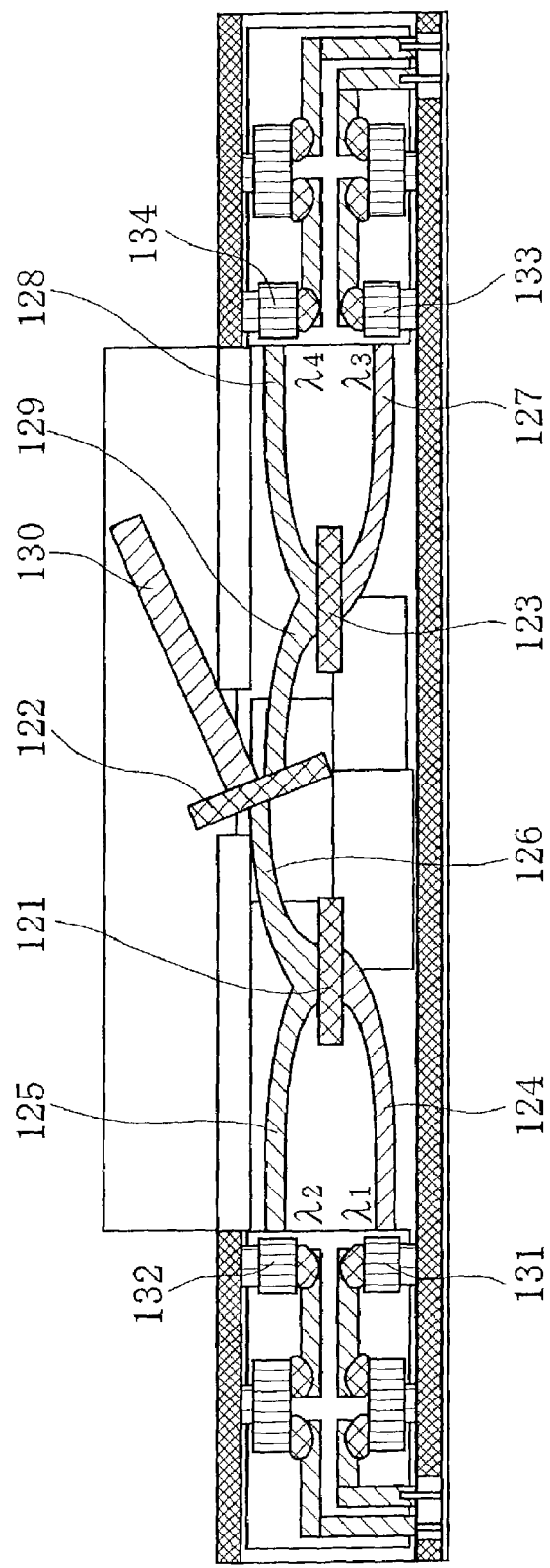
FIG. 10 shows a structural drawing of an optical device of preferred embodiment 7 of the present invention.

FIG. 10 shows a configuration of an optical device according to preferred embodiment 7.

The optical device of this preferred embodiment has a configuration that the optical device according to preferred embodiment 5 (refer to FIG. 7) is arranged at the left side portion in FIG. 10, and the optical device having a configuration where the left side portion of the optical device is reversed right and left, is arranged at the right side portion of FIG. 10. A laser diode that emits the light with the wavelength $\lambda 1$ herein is chosen as a laser diode 131, and a laser diode that emits the light with the wavelength $\lambda 2$ is chosen as a laser diode 132. A WDM filter 121 is then set so as to pass the light with the wavelength $\lambda 1$ but reflect the light with the wavelength $\lambda 2$. In addition, a laser diode that emits light with a wavelength $\lambda 3$ is chosen as a laser diode 133, and a laser diode that emits light with a wavelength $\lambda 4$ is chosen as a laser diode 134. A WDM filter 123 is then set so as to pass the light with the wavelength $\lambda 3$ but to reflect the light with the wavelength $\lambda 4$.

A WDM filter 122 is then inserted into the portion where the right side portion and the left side portion are joined. In addition, a waveguide path 130 is further formed at the right side of the WDM filter 122. The WDM filter 122 herein is set so as to pass the light with the wavelengths $\lambda 1$ and $\lambda 2$, but to reflect the light with the wavelengths $\lambda 3$ and $\lambda 4$, and is arranged in the direction so as to reflect the light transmitted through the wavepath 129 to a waveguide path 130.

In the optical device according to such configuration, the light with the wavelengths $\lambda 1$ and $\lambda 2$ emitted by the laser diodes 131 and 132 are mixed into a waveguide path 126, pass the WDM filter 122, and then reach the waveguide path 130. On the other hand, the light with wavelengths $\lambda 3$ and $\lambda 4$ emitted by the laser diodes 133 and 134 are mixed into the waveguide path 129, reflected by the WDM filter 122, and then reach the waveguide path 130.

Consequently, the light with wavelengths $\lambda 1$, $\lambda 2$, $\lambda 3$, and $\lambda 4$ are mixed and output from the waveguide path 130.

Preferred Embodiment 8

Figure 11:
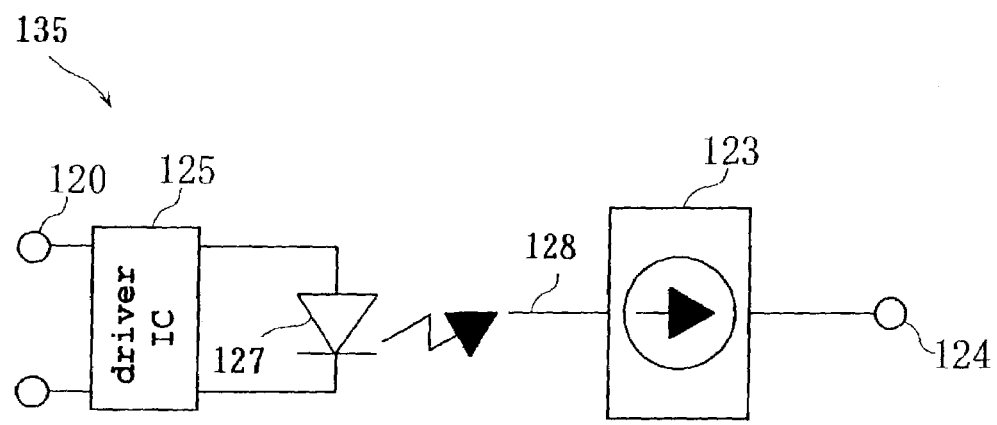
FIG. 11 shows a schematic diagram of an optical module for use in transmission according to preferred embodiment 8 of the present invention.

Using the optical device shown in the preferred embodiments described up to above, it is possible to make an optical module for use in transmission, an optical module for use in reception, and an optical module for use in transmission and reception of the present invention for transmitting and receiving light. FIG. 11 shows a configuration example of an optical module for use in transmission 135 that is one example of the optical module for use in transmission according to the present invention.

The optical module for use in transmission according to FIG. 11 comprises a driver IC 125, wherein an electrical input terminal 120 is connected to its input side, and a laser diode 127 is connected to its output side. The laser diode 127 is then positioned relative to a waveguide path 128 and a light output terminal 124 is connected to an end of the waveguide path 128. In addition, an isolator 123 is inserted in the middle of the waveguide path 128.

When corresponding the optical module for use in transmission 135 according to the configuration described above to the optical device described in FIG. 4(a), the electrical input terminal 120 corresponds to the wiring pattern (not shown in figure) connected to the signal junction 45 and formed on the dielectric substrate 47, the driver IC 125 to the driver IC 44, the laser diode 127 to the laser diode 2, and the waveguide path 128 to the waveguide path 11. In addition, a wiring for connecting the driver IC 125 to the laser diode 127 corresponds to the wiring pattern 48 and the wire 7. In addition, the isolator 123 is inserted along a groove (not shown in figure) which is perpendicularly formed on the glass substrate 41 relative to the waveguide path 11 in the middle of the waveguide path 11. The light output terminal 124 is then connected to an end of the waveguide path 11 as a V-shaped groove 13 (FIG. 15), and an optical fiber cable (not shown in figure) is connected to the V type groove 13.

According to the optical module for use in transmission 135 for such configuration, corresponding light signals can be output from the light output terminal 124 into an optical fiber cable depending upon electrical signals being input into the electrical input terminal 120, a small size and low cost optical module with decreased manufacturing process can be provided.

Figure 12:
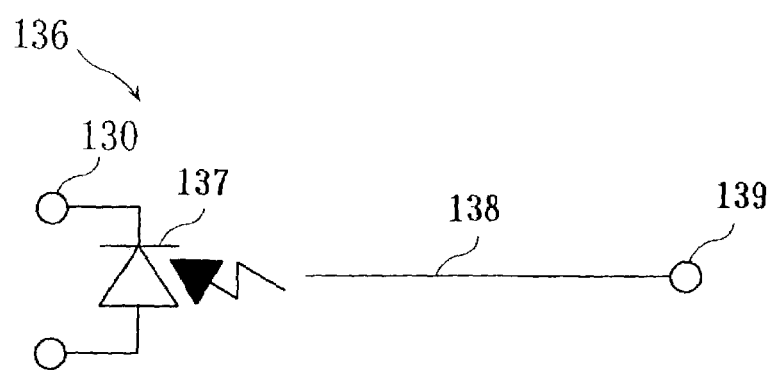
FIG. 12 shows a schematic diagram of an optical module for reception according to preferred embodiment 8 of the present invention.

Next, FIG. 12 shows a configuration example of an optical module for reception 136 that is one example of an optical module for reception of the present invention.

An optical module for reception 136 according to FIG. 12 comprises a photodiode 137 having an electrical output terminal 130 at the output side thereof, the photodiode 137 is positioned on one side of a waveguide path 138 and connected thereto, and a light input terminal 139 is connected to the other side of the waveguide path 138.

The optical module for reception 136 according to the configuration described above can be achieved by replacing the laser diode 2 in the optical device according to FIG. 1 with the photodiode 137. In this case, the electrical output terminal 130 corresponds to the wiring pattern 8, and the waveguide path 138 corresponds to the waveguide path 11. The light input terminal 139 is then connected to an end of the waveguide path 11 as the V-shaped groove 13 (FIG. 15), and an optical fiber cable (not shown in figure) is connected to the V type groove 13.

According to the optical module for reception 136 for such configuration, corresponding electrical signals can be output from the electrical output terminal 124 depending upon light signals being input into the light input terminal 139, a small size and low cost optical module with decreased manufacturing process can be provided.

Figure 13:
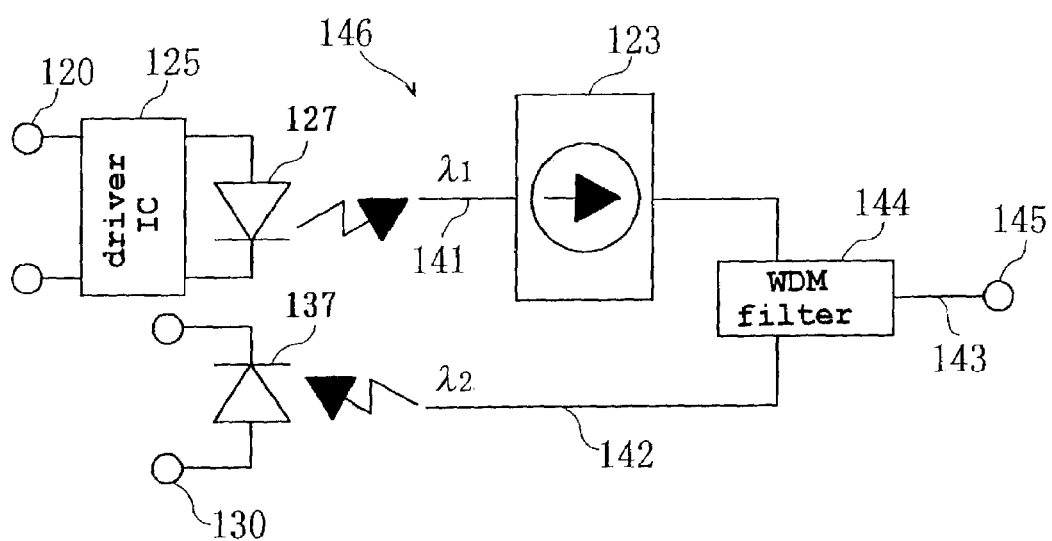
FIG. 13 shows a schematic diagram of an optical module for use in transmission and reception according to preferred embodiment 8 of the present invention.

Next, FIG. 13 shows a configuration of an optical module for transmission and reception 146 that is one example of an optical module for transmission and reception of the present invention.

An optical module for use in transmission and reception 146 shown in FIG. 13 includes an electrical input terminal 120, a driver IC 125, and a laser diode 127 configured similar to the case in the optical module for use in transmission 135 shown in FIG. 11 in the transmission portion, and also includes an electrical output terminal 130 and a photodiode 137 configured similar to the case in the optical module for reception 136 shown in FIG. 12 in the reception portion. The laser diode 127 is then positioned relative to a waveguide path 141 and is connected to one surface of a WDM filter 144. A waveguide path 142 is connected to the other surface of the WDM filter 144, the photodiode 137 is connected to the waveguide path 142, and the electrical output terminal 130 is connected to the photodiode 137. In addition, the isolator 123 is connected in the middle of the waveguide path 141.

When corresponding the optical module for use in transmission and reception 146 according to the configuration described above to the optical device described in FIG. 6, the electrical input terminal 120 corresponds to the wiring pattern (not shown in figure) connected to the signal junction 45 and formed on the dielectric substrate 76, and the driver IC 125 corresponds to the driver IC 44, the laser diode 127 to the laser diode 44, the photodiode 137 to the photodiode 74, the waveguide path 141 to the waveguide path 71, and the WDM filter 144 to the WDM filter 72. In addition, the waveguide path 142 corresponds to the path from the WDM filter 72 to the photodiode 74, the electrical output terminal 130 corresponds to the wiring pattern (not shown in figure) on the dielectric substrate 76 connected to the wire 75, and a light input/output terminal 145 corresponds to the V-shaped groove 13 connected to the end of the waveguide path 71. In addition, an optical fiber cable (not shown in figure) is connected to the V-shaped groove 13.

According to the optical module for use in transmission and reception 146 for such configuration, corresponding light signals can be output from the light output terminal 124 into an optical fiber cable depending upon electrical signals being input into the electrical input terminal 120, in addition, corresponding electrical signals can be output from the electrical output terminal 130 depending upon light signals being input from an optical fiber cable, a small size and high performance, low cost optical module with decreased manufacturing process can be provided.

In addition, when a plurality of optical modules for transmission and reception like these are prepared and connected through the optical fiber cable, they can be used as an optical transmission system for transmission and reception.

Incidentally, although the optical module for use in transmission 135 is explained by corresponding to FIG. 4(*a*) according to the above description, the optical module for use in transmission 135 may be configured so as to comprise any optical devices shown in FIGS. 4(*b*), 5, 7 and 10.

In addition, according to the above description, it is explained that the optical module for reception 136 can be realized by means of replacing the laser diode 2 with the photodiode 137 in the optical device according to FIG. 1, it may be configured so as to comprise the optical device according to FIGS. 2, 4, 5, 7 and 10. When the optical device shown in FIGS. 4, 5, 7, and 10 is comprised herein, a reception front end IC is employed instead of each driver IC. In addition, when comprising the optical device shown in FIGS. 7 and 10, by means of a reverse action to the action described in preferred embodiments 5 and 7 as described above (that is, light travels in the backward direction), if the light with two or more wavelengths is input, the light is divided by each WDM filter, and the light with each wavelength is converted into an electrical signal by each photodiode.

In addition, according to the above description, the optical module for use in transmission and reception 146 is explained corresponding to the configuration shown in FIG. 6, the optical module for use in transmission and reception 146 may be configured so as to comprise any optical device shown in FIGS. 4(*b*), 5, 7, and 10.

In that case, as described in preferred embodiment 4, each WDM filter may be inserted at an angle of, for example, 45 degrees relative to the waveguide path to which each input-output terminal is connected, and each photodiode may be arranged at a side of each WDM filter.

In addition, according to the above description, it is explained that the optical module for use in transmission 135 and the optical module for use in transmission and reception 146 include the isolator 123, a configuration that does not include the isolator 123 may be considered if a transmission rate is equal to or less than 2.5 Gbps.

In the explanation according to each preferred embodiment up to the above description, although it is explained that each heat sink is metallic, it may not be metallic as far as it is a material having high heat transferability or thermal conductivity such as diamond, carbon fiber or the like, and in that case, each laser diode or each driver IC are grounded by way of other than the heat sink. In addition, in that case, it is not necessary to be a conductive paste, but any material may be used for that purpose as far as it is a material having high thermal conductivity for connecting each laser diode or each driver IC to each heat sink. For the material having such high thermal conductivity, for example, silicone resin is provided.

In addition, although it is explained that the cross section of the lateral groove is rectangular, it may have a V-shaped cross section, or a U-shaped cross section, as far as it has a groove shape to be integrally molded into each glass substrate, it may provide similar effects whatever shape it may have.

Figure 14:
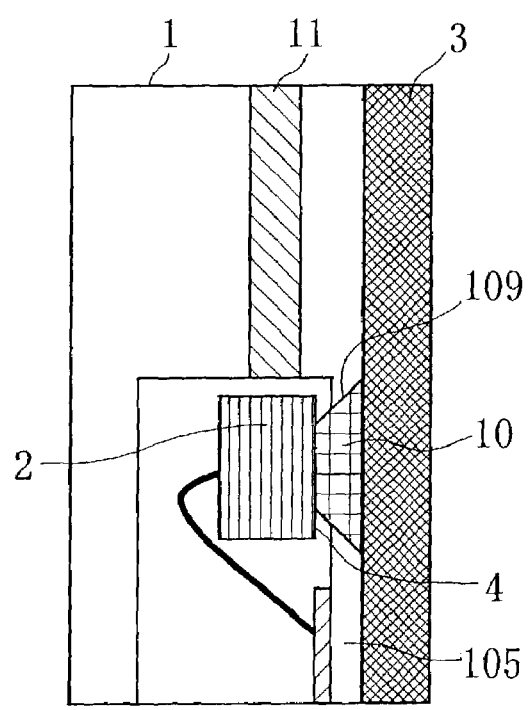
FIGS. 14(a)–14(b) show an alternative example of an optical device according to preferred embodiment 1–6 of the present invention.
Figure 14:
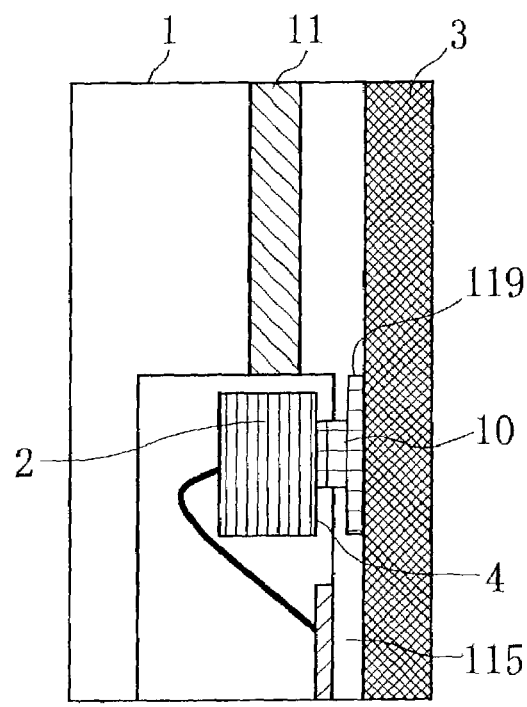

Further, although it is illustrated that each groove formed in each side wall is formed so as to be a parallel shape in the side wall, the shape thereof may be formed so as to spread from the active layer proximity surface of each semiconductor light emitting element toward each heat sink. FIG. 14(*a*) illustrates a construction of the optical device where a lateral groove 109 formed in a side wall 105 spreads in a tapered shape from the active layer proximity surface 4 of the laser diode 2 toward the heat sink 3. In addition, FIG. 14(*b*) illustrates a construction of the optical device where a lateral groove 119 formed in the side wall 115 spreads in a stepped shape from the active layer proximity surface 4 of the laser diode 2 toward the heat sink 3. In these cases, since the area of the active layer proximity surface 4 where the conductive paste 10, which fills each lateral groove, is connected is larger than the area of the heat sink 3 where its paste is connected, the closer to the heat sink 3, the more the transfer ratio to the heat sink 3 of the heat radiating from the active layer proximity surface 4 of the laser diode 2 increases. Accordingly, when such lateral grooves 109 and 119 are formed, the heat radiated from the active layer proximity surface 4 of the laser diode 2 is transferred more efficiently, and then the heat radiation efficiency to the heat sink 3 is further increased. Consequently, it is possible to provide a smaller size optical device than the optical device explained in each embodiment described above. Incidentally, in this case, any shape of each lateral groove, even the tapered shape or the stepped shape, provides the similar effect as far as it has a shape spreading from the active layer proximity surface of each semiconductor light emitting element to each heat sink.

In addition, the groove formed in each side wall may be a hole shaped (aperture-shaped) rather than a grooved shape (each lateral groove). In that case, it can not be integrally molded into each glass substrate, after each waveguide path, each concave portion, and each marker are integrally molded, a through-hole may be bored in each side wall as one example of an aperture of the present invention. Even in this case, it can provide the same effect as described above in terms of the effect for radiating the heat from each laser diode to each heat sink.

In addition, although it is explained that each one of each horizontal position marker 16 and vertical position marker 17 are formed on the each glass substrate, respectively, a plurality of these markers may be formed, respectively.

Further, although it is explained that each laser diode or the like is mounted on each glass substrate, a resin type substrate may be employed instead of the glass substrate. In that case, each substrate is integrally formed by dry etching or the like.

In addition, although the explanation is made of the example of the laser diode and the driver IC as the semiconductor element that needs heat radiation, it is applicable to the arbitrary semiconductor element that needs heat radiation without limiting to these.

In addition, although it is explained that only the active layer proximity surface of each semiconductor light emitting element is connected to the heat sink arranged at the edge of each substrate, it may be configured that the active layer proximity surface of each semiconductor light emitting element is connected to one heat sink arranged at the edge of each substrate, and the outside surface in the depthwise direction opposed each active layer proximity surface of each semiconductor light emitting element is connected to the heat sink arranged at the other edge of each substrate. In that case, it may be preferable that one side is connected using the conductive material (conductive paste, carbon fiber) and is provided with the ground potential simultaneously, the other side is connected using non-conductive material (diamond etc.) among connections to each heat sink.

In addition, although it is explained that each active layer proximity surface among outside surfaces of the present invention of each semiconductor element is connected to each heat sink, it may be configured that the outside surface opposed each active layer proximity surface among outside surfaces of the present invention of each semiconductor light emitting element is connected to each heat sink instead of connecting each active layer proximity surface to each heat sink. In this case, the distance between the outside surface which is closer to each heat sink and the active layer junction surface 5 is larger than the distance between the active layer junction surface 5 and the active layer proximity surface 4 farther from each heat sink.

In addition, although it is shown that each active layer proximity surface opposes in parallel with a surface of each heat sink, it may be arranged to oppose each heat sink, in this case, each active layer proximity surface may be obliquely arranged relative to each heat sink, and is thought to be opposed in an arbitrary state other than perpendicular. In addition, according to the description so far, although it is assumed that each heat sink is perpendicularly arranged relative to each active layer proximity surface, it may be arranged in an arbitrary angle other than parallel.

Further, although it is explained that the active layer junction surface of each semiconductor light emitting element is arranged in parallel with each active layer proximity surface, it may be arranged in any state as far as the active layer junction surface of each semiconductor light emitting element is arranged in a state to be opposed each heat sink.

Although it has been explained that the active layer junction surface 5 of each semiconductor light emitting element is arranged to be opposed each heat sink, it may be configured that the active layer junction surface 5 of each semiconductor light emitting element is arranged to face the bottom surface of each substrate, and each active layer proximity surface is connected to each heat sink by the wiring pattern or the like. The manufacturing process is decreased and a low cost optical device can also be provided in this case since it is not necessary to form via holes in each substrate.

Although it has been explained that each heat sink is arranged at the edge of each substrate, it may be added to the edge of each heat sink, and the heat sink may also be arranged at the bottom of each substrate. In that case, it can provide the same effect as described above as far as it is constituted that each heat sink arranged at the edge of each substrate is connected to a heat sink arranged at the bottom of each substrate, and heat generated from each semiconductor element is radiated through the heat sink arranged at the edge of each substrate.

According to the present invention, a low cost optical device, a method of manufacturing the same, an optical module, or an optical transmission system with decreased manufacturing process can be provided.

In addition, when an active layer junction surface of a semiconductor light emitting element is arranged to oppose a heat dissipation plate, a small and low cost optical device, a method of manufacturing the same, an optical module or an optical transmission system can be provided.

In addition, when a large portion of an outer surface in the depthwise direction of a semiconductor light emitting element is connected to a groove or a hole formed in the substrate, a further small and low cost optical device, a method of manufacturing the same, an optical module or an optical transmission system can be provided.

In addition, when an outside surface in the depthwise direction of a semiconductor light emitting element and an active layer junction surface are arranged in proximity to a heat dissipation plate, a further small and low cost optical device, a method of manufacturing the same, an optical module or an optical transmission system can be provided. In addition, when a substrate is integrally molded into a mold glass, a low cost optical device, a method of manufacturing the same, an optical module or an optical transmission system with further decreased manufacturing process can be provided.

In addition, when a heat dissipation plate is metallic, a further low cost optical device, a method of manufacturing the same, an optical module, or an optical transmission system can be provided.

What is claimed is:

1. An optical device, comprising:
   a semiconductor element requiring heat radiation,
   a first substrate having a top surface and a side surface and providing a mount for said semiconductor element, said substrate further including a concave portion formed in said top surface and defined by sidewalls at least partially surrounding said concave portion; and
   a heat dissipation plate arranged along said side surface of said first substrate for radiating heat generated from said semiconductor element, wherein said semiconductor element is mounted to a first sidewall of said concave portion and connected to said heat dissipation plate through a groove formed through said first sidewall.

2. The optical device according to claim 1, in which said heat dissipation plate is metallic, and said heat dissipation plate and said semiconductor device are connected by a conductive paste.

3. The optical device according to claim 1, in which a second substrate is further mounted to said heat dissipation plate.

4. The optical device according to claim 1, wherein said semiconductor element is a semiconductor light emitting element having an active layer junction surface, and two outside surfaces opposed to said active layer junction surface, in which said heat dissipation plate is arranged to oppose said active layer junction surface.

5. The optical device according to claim 4, in which a large portion of the outside surface closer to said heat dissipation plate of said semiconductor light emitting element is connected to said heat dissipation plate through a groove or a hole formed in said first substrate.

6. The optical device according to claim 5, in which said groove or hole has a shape spreading toward said heat dissipation plate from said semiconductor light emitting element.

7. The optical device according to claim 4, wherein said semiconductor light emitting element is arranged so that the distance between the outside surface closer to said heat dissipation plate and said active layer junction surface becomes narrower than the distance between the outside surface farther from said heat dissipation plate and said active layer junction surface.

8. The optical device according to claim 4, in which said first substrate is integrally molded into a mold glass.

9. An optical module for use in transmission, comprising:
   a light output terminal;
   the optical device according to claim 4 connected to said light output terminal; and
   an electrical input terminal connected to said optical device.

10. An optical module for use in transmission and reception, comprising;
    a light input/output terminal;
    the optical device according to one of claims 4, 3, connected to said light input/output terminal, and further comprising a semiconductor light receiving element; and
    an electrical input terminal and an electrical output terminal, which are connected to said optical device.

11. An optical transmission system for use in transmission and reception, comprising:
    the optical module for use in transmission and reception according to claim 10; and
    an optical fiber cable connected to said optical module for use in transmission and reception.

12. An optical module for use in reception, comprising;
    a light input terminal;
    the optical device according to claim 1, connected to said light input terminal, said semiconductor element being a semiconductor light receiving element; and
    an electrical output terminal connected to said optical device.

13. An optical transmission system for use in transmission and reception, comprising:
    an optical module for use in transmission, comprising: a light output terminal; a first optical device according to claim 1, wherein said semiconductor element of said first optical device is a semiconductor light emitting element having an active layer junction surface, and two outside surfaces opposed to said active layer junction surface, in which said heat dissipation plate of said first optical device is arranged to oppose said active layer junction surface, said first optical device being connected to said light output terminal; and an electric input terminal connected to said first optical device;
    an optical fiber cable connected to said optical module for use in transmission; and
    an optical module for use in reception, comprising: a light input terminal; a second optical device according to claim 1 connected to said light input terminal, said semiconductor element of said second optical device being a semiconductor light receiving element; and an electric output terminal connected to said second optical device, said optical module for use in reception being connected to said optical fiber cable.

* * * * *

UNITED STATES PATENT AND TRADEMARK OFFICE
CERTIFICATE OF CORRECTION

PATENT NO. : 7,106,766 B2  
APPLICATION NO. : 10/400981  
DATED : September 12, 2006  
INVENTOR(S) : Kaoru Ishida et al.

It is certified that error appears in the above-identified patent and that said Letters Patent is hereby corrected as shown below:

Title Page, Item (56) References Cited, U.S. PATENT DOCUMENTS  
Change "6,301,278 B1" to -- 6,301,278 B2 --

Column 18  
Line 32, change "4, 3," to -- 2-8 --

Signed and Sealed this

Sixth Day of February, 2007

JON W. DUDAS  
*Director of the United States Patent and Trademark Office*